(12) United States Patent
Tominaga et al.

(10) Patent No.: US 12,151,438 B2
(45) Date of Patent: Nov. 26, 2024

(54) IMAGE PROCESSING DEVICE, IMAGE PROCESSING METHOD, AND COMPUTER READABLE MEDIUM THAT PROCESS AN IMAGE IN WHICH A WIRING PATTERN IS DRAWN AND OUTPUTS THE IMAGE AS RASTER DATA

(71) Applicant: FUJI CORPORATION, Chiryu (JP)

(72) Inventors: Ryojiro Tominaga, Okazaki (JP); Akihiro Kawajiri, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 339 days.

(21) Appl. No.: 17/762,838

(22) PCT Filed: Sep. 24, 2019

(86) PCT No.: PCT/JP2019/037221
§ 371 (c)(1),
(2) Date: Mar. 23, 2022

(87) PCT Pub. No.: WO2021/059324
PCT Pub. Date: Apr. 1, 2021

(65) Prior Publication Data
US 2022/0332052 A1 Oct. 20, 2022

(51) Int. Cl.
*B29C 64/386* (2017.01)
*B33Y 50/00* (2015.01)

(52) U.S. Cl.
CPC ............ *B29C 64/386* (2017.08); *B33Y 50/00* (2014.12)

(58) Field of Classification Search
CPC ................ B29C 64/112; B29C 64/386; B29L 2031/3425; B33Y 10/00; B33Y 30/00;
(Continued)

(56) References Cited

U.S. PATENT DOCUMENTS 5,327,260 A   7/1994  Shimomae et al.
5,333,273 A *  7/1994  Raasch ................. G06F 3/0489
                                                       708/139
(Continued)

FOREIGN PATENT DOCUMENTS

JP        5-207282 A     8/1993

OTHER PUBLICATIONS

International Search Report issued Dec. 17, 2019 in PCT/JP2019/037221 filed Sep. 24, 2019, 2 pages.

*Primary Examiner* — Chun Cao
(74) *Attorney, Agent, or Firm* — Oblon, McClelland, Maier & Neustadt, L.L.P.

(57) ABSTRACT

An image processing device that processes an image in which a wiring pattern is drawn and outputs the image as raster data in which formation content of wiring print dots is defined for each pixel, includes an input section that receives the image, a scan section that sequentially performs scanning in a scan direction at intervals of the pixel width, a calculation section that calculates an intersection-to-intersection distance in the scan direction based on positions of the intersection points, and a determination section that determines a line width of the wire in the scan direction and determine formation of dots for the determined line width for each pixel based on the intersection-to-intersection distance, the prescribed width, and a line width of an inclination wire which is the line width, in the scan direction, of a wire inclined according to the prescribed angle.

7 Claims, 8 Drawing Sheets

(58) Field of Classification Search
CPC ....... B33Y 50/00; B33Y 80/00; G06T 11/203; H05K 1/0284; H05K 2203/163; H05K 3/0005; H05K 3/0014; H05K 3/10; H05K 3/1241
USPC ........................................................ 700/119
See application file for complete search history.

(56) References Cited

U.S. PATENT DOCUMENTS

| | | | |
|---|---|---|---|
| 11,057,528 B2 * | 7/2021 | Murasawa | H04N 1/00087 |
| 2002/0141647 A1 * | 10/2002 | Mitsui | G06T 7/62 |
| | | | 382/201 |
| 2004/0213435 A1 * | 10/2004 | Hatakeyama | H04N 1/00031 |
| | | | 382/162 |
| 2012/0250054 A1 * | 10/2012 | Mitsuhashi | H04N 1/506 |
| | | | 358/448 |

* cited by examiner

| LINE WIDTH W ($\mu$m) | | NUMBER OF DOTS (X DIRECTION) | |
|---|---|---|---|
| 0° | 45° (135°) | 0° | 45° (135°) |
| 42.33 | 59.87 | 1 | 1 |
| 84.67 | 119.74 | 2 | 3 |
| 127.00 | 179.60 | 3 | 4 |
| 169.33 | 239.47 | 4 | 6 |
| 211.67 | 299.34 | 5 | 7 |
| 254.00 | 359.21 | 6 | 8 |
| 296.33 | 419.08 | 7 | 10 |
| ⋮ | | | |

IMAGE PROCESSING DEVICE, IMAGE PROCESSING METHOD, AND COMPUTER READABLE MEDIUM THAT PROCESS AN IMAGE IN WHICH A WIRING PATTERN IS DRAWN AND OUTPUTS THE IMAGE AS RASTER DATA

TECHNICAL FIELD

The present specification discloses an image processing device, an image processing method, and a program.

BACKGROUND ART

Conventionally, a device for recognizing a line segment shape of a boundary part between a black dot region and a white dot region for image data in a bitmap shape has been proposed as such an image processing device. For example, Patent Literature 1 describes a device in which characteristics of a line segment shape recognized for each dot is replaced with code information of multiple bits, and predetermined correction is performed on a dot for which correction is determined to be required by using the code information. Further, in this device, when white dots adjacent in a horizontal direction of an oblique line segment having an inclination angle of 45 degrees or closer to 45 degrees are detected, correction for adding dots of a fraction of a width of a standard black dot, and thus, the oblique line segment is made to have a thickness equivalent to a horizontal line.

PATENT LITERATURE

Patent Literature 1: JP-A-H5-207282

BRIEF SUMMARY

Technical Problem

In such an image processing device, an image may be processed to form a wiring pattern by dot print by using conductive ink or the like. In this case, when the wiring pattern is drawn by 3D data such as polygon data, it is necessary to perform processing of determining formation content of dots of each pixel by extracting an outline of a wire from the 2D data obtained by slicing the 3D data. In this processing, when a starting point or an end point for extracting the outline of the wire is shifted, determination of rounding up or rounding down pixels counted within a line width of the wire varies, and thus, the number of pixels may differ and the line width may change within the same wire or between adjacent wires having the same width. Since electric resistance of the formed wire also changes when a line width changes, it is demanded to suppress as much as possible a variation in line width by including an oblique wire. In addition, although it is conceivable to apply the correction described above in order to suppress the variation in the line width of the oblique wire, it takes time to perform the processing.

A principal object of the present disclosure is to make appropriate determination by suppressing a variation in line width of each wire from an image in which a wiring pattern is drawn.

Solution to Problem

The present disclosure takes following means to achieve the principal object described above.

An image processing device of the present disclosure is an image processing device that processes an image in which a wiring pattern is drawn and outputs the image as raster data in which formation content of wiring print dots is defined for each pixel, and has a key point including an input section that receives the image in which the wiring pattern including a wire having a prescribed width that is an integer multiple of a pixel width and a prescribed angle that is an integer multiple of a predetermined angle is drawn, a scan section that sequentially performs scanning in a scan direction at intervals of the pixel width in a direction orthogonal to the scan direction to detect respective intersection points between an outline of the wire and respective scan lines, a calculation section that calculates an intersection-to-intersection distance in the scan direction based on positions of the intersection points, and a determination section that determines a line width of the wire in the scan direction and determine formation of dots for the determined line width for each pixel based on the intersection-to-intersection distance, the prescribed width, and a line width of an inclination wire which is the line width, in the scan direction, of a wire inclined according to the prescribed angle.

The image processing device of the present disclosure sequentially performs scanning in a scan direction at intervals of pixel widths in a direction orthogonal to the scan direction, detects intersection points between outlines of wires in the wiring pattern and respective scan lines, and calculates an intersection-to-intersection distances in the scan direction based on positions of the intersection points. Then, a line width of a wire is determined based on an intersection-to-intersection distance, a prescribed width of the wire, and a line width of an inclination wire which is a line width in the scan direction of a wire inclined according to a prescribed angle, and formation of a dot corresponding to the determined line width is determined for each pixel. Thereby, as long as a wire having a prescribed width not inclined in a scan direction is provided, a line width can be appropriately determined based on an intersection-to-intersection distance and the prescribed width. Further, even in an inclination wire that is inclined according to a prescribed angle, a line width can be appropriately determined based on an intersection-to-intersection distance and a line width of the inclination wire. Therefore, a line width can be appropriately determined by suppressing a variation in line width of each wire from an image on which a wiring pattern is drawn.

DESCRIPTION OF EMBODIMENTS

Figure 1:
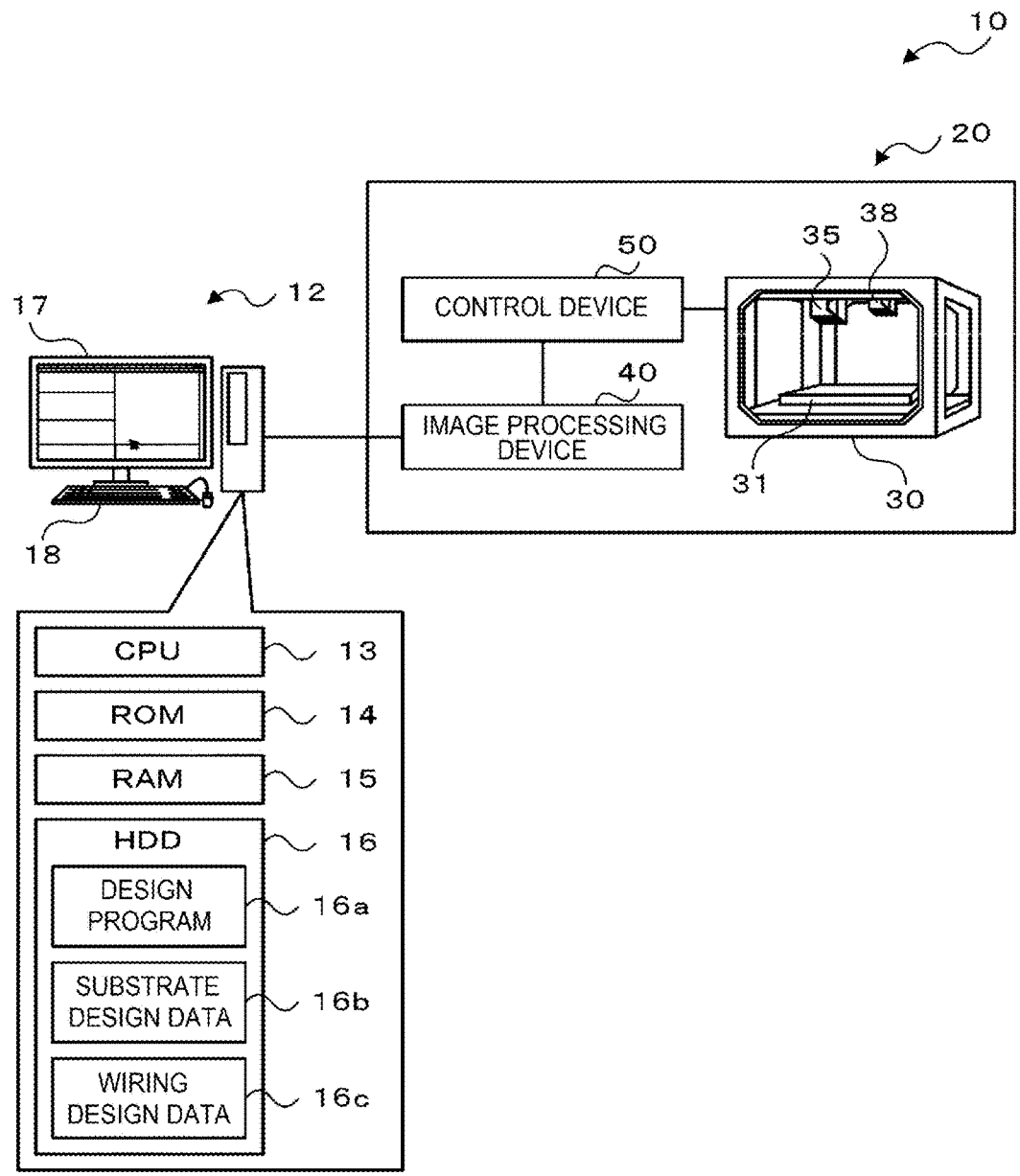
FIG. 1 is a configuration diagram schematically illustrating a configuration of wiring board manufacturing system 10.

Next, an embodiment of the present disclosure will be described with reference to the drawings. FIG. 1 is a configuration diagram schematically illustrating a configuration of wiring board manufacturing system 10, and FIG. 2 is a block diagram illustrating an electrical connection relationship of 3D printer unit 20.

As illustrated in FIG. 1, wiring board manufacturing system 10 includes design device 12 and 3D printer unit 20 and is configured as a system that designs and manufactures a wiring board on which a wiring pattern (wiring layer) is formed on a resin base material (resin layer). Design device 12 is configured as a computer including CPU 13, ROM 14, RAM 15, HDD 16, and so on, and is connected to display device 17 such as a liquid crystal display, and input device 18 such as a keyboard. HDD 16 stores design program 16a for designing a target object such as a wiring board by using three-dimensional (3D) CAD, and substrate design data 16b and wiring design data 16c required for a design. Substrate design data 16b is required for designing a resin base material and includes a size and a thickness of the resin base material, the number of layers of the resin layer, and so on. Wiring design data 16c is required for designing a wiring pattern and includes data such as a line width and a line thickness of wiring in the wiring pattern, an angle of inclination of the wiring, and so on. Design device 12 designs a wiring board of a 3D shape with design program 16a while using substrate design data 16b and wiring design data 16c according to an instruction of an operator via input device 18.

Figures 2, 3:
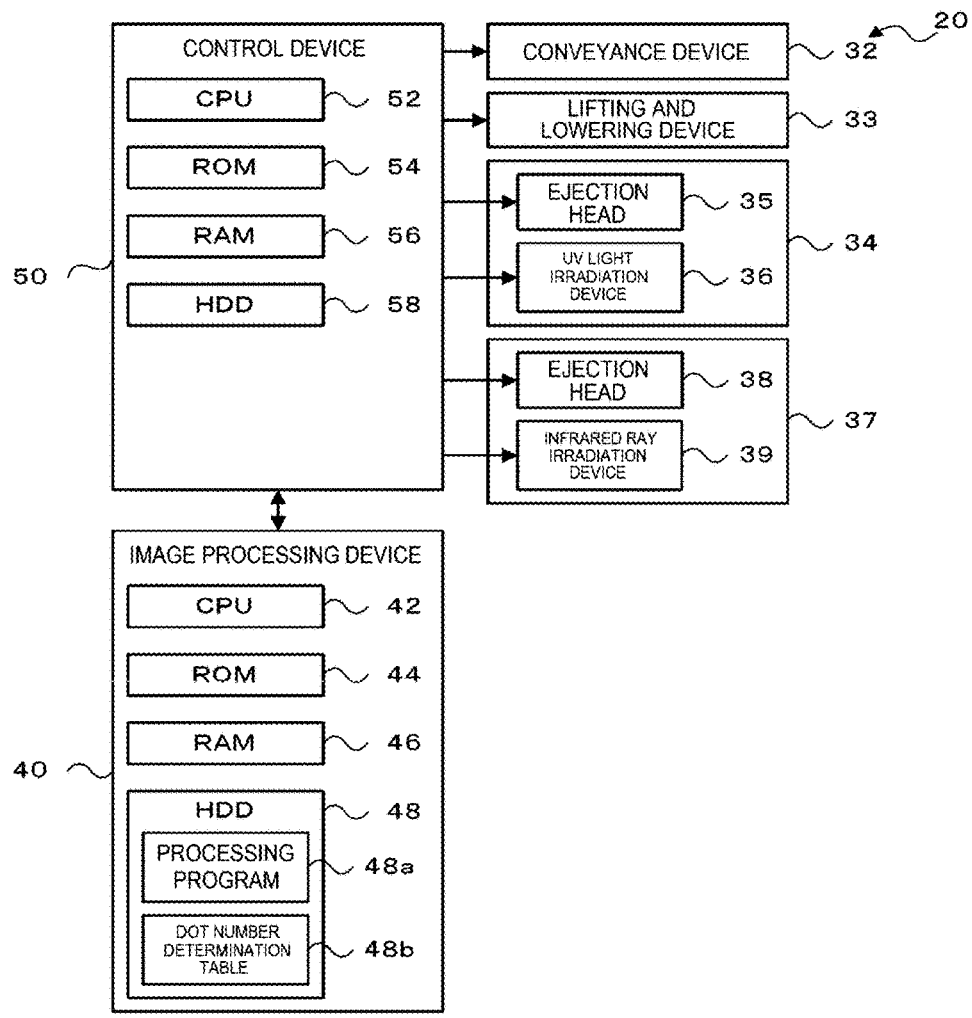
FIG. 2 is a block diagram illustrating an electrical connection relationship of 3D printer unit 20.
FIG. 3 is an explanatory diagram illustrating an example of wiring design data 16c.

FIG. 3 is an explanatory diagram illustrating an example of wiring design data 16c. As illustrated in the drawing, wiring design data 16c defines prescribed width SW (μm) that prescribes a line width of wiring to be designed, and prescribed angle SA (°) that prescribes an angle of inclination of wiring to be designed. Prescribed width SW is defined as a width that is integer N times a predetermined width. The predetermined width is a width corresponding to a print resolution in 3D printer unit 20 or the like which is an output destination of a design image, and when the resolution is 300 dpi, a predetermined width which is pixel width GW corresponding to a size of one pixel becomes 84.67 μm, and when the resolution is 600 dpi, a predetermined width which is pixel width GW corresponding to the size of one pixel becomes 42.33 μm. In the present embodiment, a case where a resolution is 600 dpi is exemplified. Accordingly, the predetermined width is 42.33 μm, and prescribed width SW is a width (42.33 μm, 84.67 μm, 127.00 μm, . . . ) that is integer N times the predetermined width. Any one of widths of integer N times the predetermined width may be used as prescribed width SW, and multiple prescribed widths SW such as two times or three times the predetermined width may be mixed in one design image. Further, prescribed angle SA is defined as an angle that is integer N times the predetermined angle. In the present embodiment, the predetermined angle is 45°, and prescribed angle SA is defined as integer N times of 45° (0°, 45°, 90°, 135°, . . . ). In the following description, the angle of 45° includes an angle of an obliquely inclined wire, such as 135°. The predetermined angle is not limited to 45° and may be 30°. Design device 12 designs a wiring board in which a wiring pattern including wirings based on prescribed width SW and prescribed angle SA are drawn as 3D data. The wiring pattern may include a wire other than prescribed width SW. Design device 12 designs a wiring board with polygon data in which a surface shape of a target object such as an STL is expressed by a polygon mesh as 3D data, displays a design image of the wiring board on display device 17 as a design result, or outputs the design image to 3D printer unit 20.

As illustrated in FIG. 1 and FIG. 2, 3D printer unit 20 includes printer body 30, image processing device 40, and control device 50. Printer body 30 includes stage 31, conveyance device 32, lifting and lowering device 33, resin layer forming unit 34, and wiring layer forming unit 37. Stage 31 is a work table on which resin layer forming unit 34 and wiring layer forming unit 37 each perform works. Conveyance device 32 causes stage 31 to reciprocate in a predetermined direction by driving of, for example, a conveyor belt or the like. Lifting and lowering device 33 lifts and lowers stage 31 conveyed to a predetermined position by conveyance device 32 in an up-down direction by driving of, for example, a ball screw or the like. Lifting and lowering device 33 lifts and lowers stage 31 such that a distance from ejection head 35 of resin layer forming unit 34 or ejection head 38 of wiring layer forming unit 37 to a formation surface is constant even when stacking of resin layers on stage 31 advances and a thickness of the resin base material increases.

Resin layer forming unit 34 includes ejection head 35 and UV light irradiation device 36 and forms a resin layer on stage 31. Ejection head 35 coats (prints) a rectangular resin layer by ejecting, for example, UV-curable resin ink from a nozzle onto stage 31. UV light irradiation device 36 cures the resin layer by irradiating the resin layer coated on stage 31 with UV light of, for example, a mercury lamp, a metal halide lamp, or the like. Wiring layer forming unit 37 includes ejection head 38 and infrared ray irradiation device 39 and forms a wiring pattern (a wiring layer) on the resin layer. Ejection head 38 coats (prints) the resin layer with conductive particle-containing ink to form a wiring pattern by ejecting the conductive particle-containing ink in which conductive particles such as metal nanoparticles (for example, gold particles, silver particles, or copper particles) are dispersed as a dispersant from a nozzle onto stage 31. Infrared ray irradiation device 39 emits infrared light along the wiring pattern on the resin layer, thereby making the wiring pattern conductive. Ejection heads 35 and 38 are configured as serial heads mounted on a carriage that is movable in a predetermined direction orthogonal to a conveyance direction of stage 31, and eject ink while moving the carriage, but may be configured as line heads in which multiple nozzles are arranged in a predetermined direction to be fixed. Resin layer forming unit 34 and wiring layer forming unit 37 are arranged side by side in the conveyance direction of stage 31, and formation of a resin layer by resin layer forming unit 34 and formation of a wiring layer by wiring layer forming unit 37 are repeated, and thus, a wiring board is built.

Image processing device 40 is configured as a computer including CPU 42, ROM 44, RAM 46, HDD 48, and so on, and processes a design image of 3D data designed by design device 12 to generate print data. HDD 48 stores processing program 48a for image processing, dot number determination table 48*b* to be described below, and so on. When a design image of the 3D data is input from design device 12, image processing device 40 generates multiple 2D image data (slice data) in which 3D data thereof is sliced in layers in a horizontal direction at predetermined intervals in the up-down direction. Next, image processing device 40 scans the 2D image data as an image to be processed, detects a wire of the wiring pattern, and determines a position, a width, a length, and so on of the wire. Subsequently, image processing device 40 generates raster data in which formation of wiring print dots is determined for each pixel as wiring print data, and generates raster data in which formation of substrate print dots is determined for each pixel as substrate print data. Then, image processing device 40 outputs the generated each print data to control device 50.

Control device 50 is configured as a computer including CPU 52, ROM 54, RAM 56, HDD 58, and so on, and controls all of 3D printer unit 20. Detection signals or the like from respective sensing sensors for sensing a position of stage 31, a position of a carriage of ejection head 35, a position of a carriage of ejection head 38, and so on are input to control device 50. Various control signals and so on are output from control device 50 to conveyance device 32, lifting and lowering device 33, ejection head 35, UV light irradiation device 36, ejection head 38, and infrared ray irradiation device 39. Further, control device 50 receives the substrate print data and the wiring print data from image processing device 40. Control device 50 forms a resin layer by controlling resin layer forming unit 34 based on the substrate print data and forms a wiring pattern by controlling wiring layer forming unit 37 based on the wiring print data, and thus, a wiring board is built in printer body 30.

Figure 4:
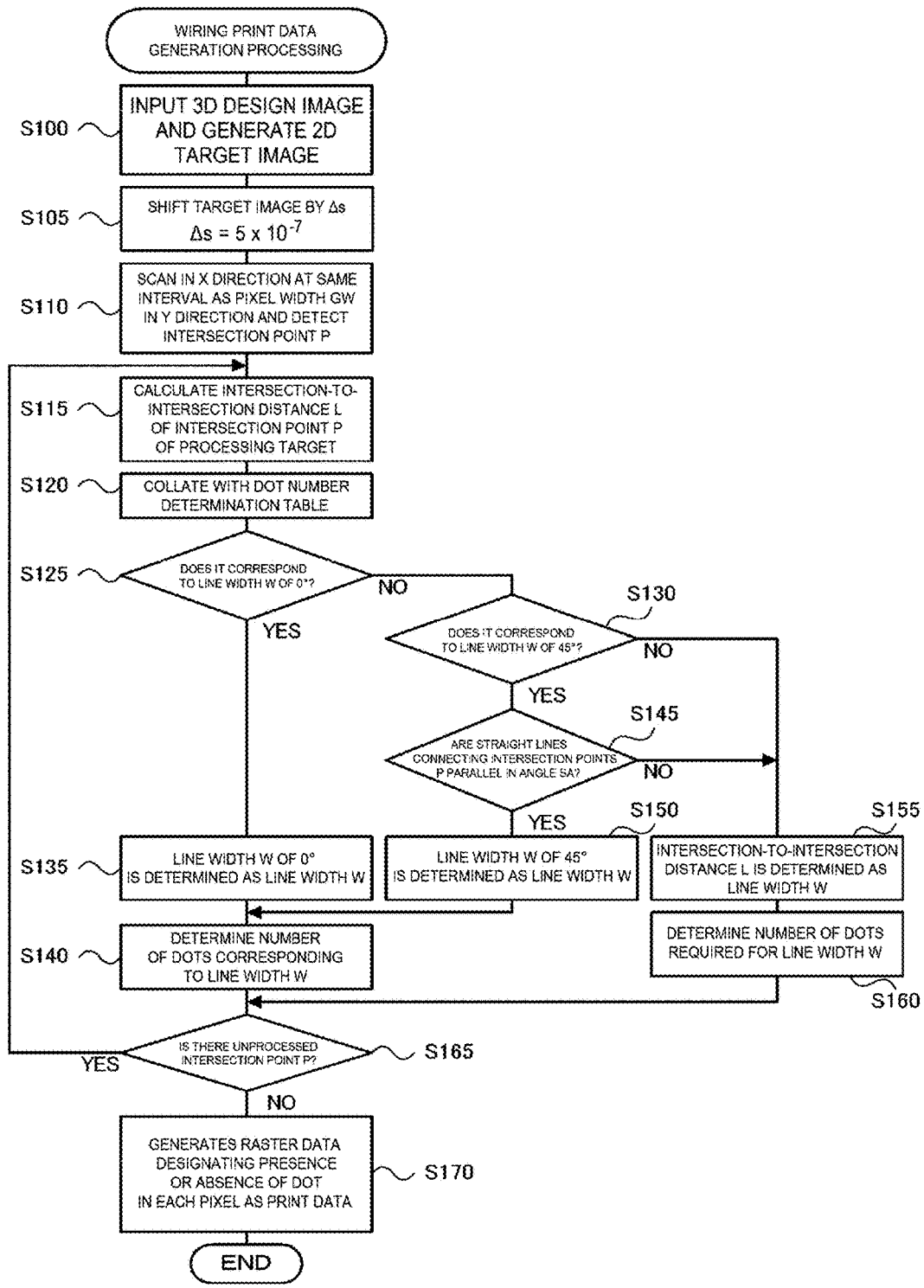
FIG. 4 is a flowchart illustrating an example of wiring print data generation processing.
Figures 5, 6:
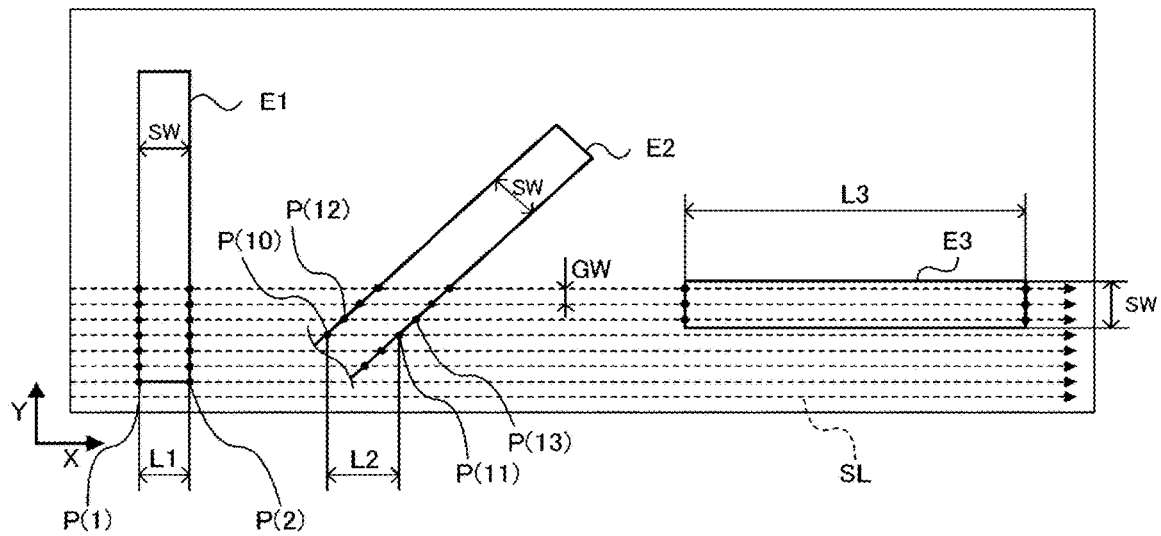
FIG. 5 is an explanatory diagram illustrating a state in which a target image is scanned.
FIG. 6 is an explanatory diagram illustrating an example of dot number determination table 48b.

Next, an operation of image processing device 40 of 3D printer unit 20 configured as described above will be described. FIG. 4 is a flowchart illustrating an example of wiring print data generation processing. This processing is performed by CPU 42 of image processing device 40 by using processing program 48*a*. FIG. 5 is an explanatory diagram illustrating a state in which a target image is scanned. In FIG. 5, a scan direction is defined as an X direction, a wiring pattern in a target image is defined as wires E, and vertical wire E1 having an angle of 0°, inclination wire E2 having an angle of 45° or 135°, and horizontal wire E3 having an angle of 90° are exemplified.

In the wiring print data generation processing, as described above, first, CPU 42 inputs a design image (3D data) of a wiring board from design device 12 and generates 2D data obtained by slicing 3D data thereof as a target image (S100). Next, CPU 42 shifts the target image by Δs in a direction in which a coordinate value thereof is reduced (S105). As is defined as a predetermined value of the number of digits exceeding the number of significant digits after a decimal point in a coordinate system of the target image on which 3D data such as polygon data is an original image. For example, in polygon data such as STL, the number of significant digits after the decimal point is 6 digits, and the target image is also the same number of digits. Accordingly, Δs is, for example, $5\times10^{-7}$ as a 7-digit value exceeding 6 digits. A reason for shifting the target image will be described below.

Next, CPU 42 scans the target image in the X direction at the same interval as pixel width GW in the Y direction, and detects intersection point P between an outline of wire E and scan line SL by a brightness change or the like (S110). Subsequently, CPU 42 calculates intersection-to-intersection distance L between two intersection points P of a processing target (S115). CPU 42 calculates, for example, intersection-to-intersection distance L1 between intersection point P(1) and intersection point P(2) in FIG. 5 by subtracting an X-coordinate value of intersection point P(1) from an X-coordinate value of intersection point P(2). CPU 42 collates calculated intersection-to-intersection distance L with line width W of dot number determination table 48*b* (S120).

FIG. 6 is an explanatory diagram illustrating an example of dot number determination table 48*b*. Dot number determination table 48*b* is stored in HDD 48, and line width W of wire E in the X direction, that is, a scan direction is associated with the number of dots required to form line width W thereof by printing. A width (42.33 μm, 84.67 μm, . . . ) that is equal to prescribed width SW described above is defined as line width W of vertical wire E1 having an angle of 0°. Further, in line width W of inclination wire E2 having an angle of 45°, a line width of the inclination wire, that is, a line width in the X direction (a scan direction) of the wire inclined according to prescribed angle SA, that is, a width (59.87 μm, 119.74 μm, . . . ) obtained by multiplying prescribed width SW by square root of 2 in the present embodiment is defined. Further, the number of dots required to form line width W of vertical wire E1 having an angle of 0°, and the number of dots required to form line width W of inclination wire E2 having an angle of 45° are respectively defined as the number of dots. As described above, prescribed width SW is defined as a width of integer N times of the predetermined width with pixel width GW corresponding to a resolution as the predetermined width. Accordingly, line width W of vertical wire E1 is integer N times the predetermined width, and the number of corresponding dots is defined as integer N. Further, the number of dots corresponding to line width W of inclination wire E2 is determined as, for example, an integer value obtained by dividing line width W by pixel width GW and by rounding a first decimal place.

Subsequently, as a result of the collation in step S120, CPU 42 determines respectively whether intersection-to-intersection distance L corresponds to line width W of an angle of 0° (S125) and whether the intersection-to-intersection distance L corresponds to line width W of an inclination wire having an angle of 45° (S130). In step S125 and step S130, by considering not only a case of matching line width W in FIG. 6 but also a detection error or the like of intersection point P, when intersection-to-intersection distance L is included in a predetermined allowable range such as ±0.1% with respect to line width W in FIG. 6, CPU 42 determines that intersection-to-intersection distance L corresponds to line width W. If it is determined in step S125 that intersection-to-intersection distance L corresponds to a line width having an angle 0°, CPU 42 determines line width W between two intersection points P of a processing target as line width W (S135) and determines the number of dots corresponding to determined line width W from dot number determination table 48*b* (S140). For example, CPU 42 determines the number of dots as one dot when line width W is determined to be 42.33 μm of an angle 0°, and determines the number of dots as two dots when line width W is determined to be 84.67 μm of an angle 0°.

Meanwhile, when it is determined in S130 that intersection-to-intersection distance L corresponds to line width W of inclination wire E2 having an angle of 45°, CPU 42 further determines whether inclinations of straight lines connecting intersection points P correspond to prescribed angle SA and are parallel to each other (S145). In the example of FIG. 5, CPU 42 determines that intersection-to-intersection distance L2 between intersection point P(10)

and intersection point P(11), and the like corresponds to line width W of an angle of 45° in FIG. 6. In this case, CPU 42 selects intersection point P(10) and intersection point P(12) closest to intersection point P(10) on next scan line SL and determines whether inclinations of straight lines connecting intersection point P(10) and intersection point P(12) are prescribed angle SA (45° or the like). Likewise, CPU 42 determines whether inclinations of straight lines connecting intersection point P(11) and intersection point P(13) closest to intersection point P(11) on next scan line SL are prescribed angle SA. In addition, when it is determined that the inclinations of the straight lines are prescribed angle SA, CPU 42 determines whether the straight lines are parallel to each other from both angles. As described above, CPU 42 checks whether inclinations of two straight lines connecting intersection point P of a processing target and intersection point P closest to each intersection point P on next scan line SL are prescribed angle SA and both straight lines are parallel to each other. Thereby, for example, when a line width of horizontal wire E3 matches line width W of inclination wire E2, or the like, it is possible to prevent erroneous determination that the wire is inclination wire E2.

When it is determined in S145 that the inclinations of the straight lines correspond to prescribed angle SA and are parallel to each other, CPU 42 determines a line width between two intersection points P of a processing target as line width W of inclination wire E2 determined to correspond to S130 (S150) and determines the number of dots corresponding to determined line width W from dot number determination table 48*b* (S140). For example, CPU 42 determines the number of dots as 3 dots when line width W is determined to be 119.74 μm at an angle of 45° and determines the number of dots as 4 dots when line width W is determined to be 179.60 μm at the angle of 45°.

Figure 7:
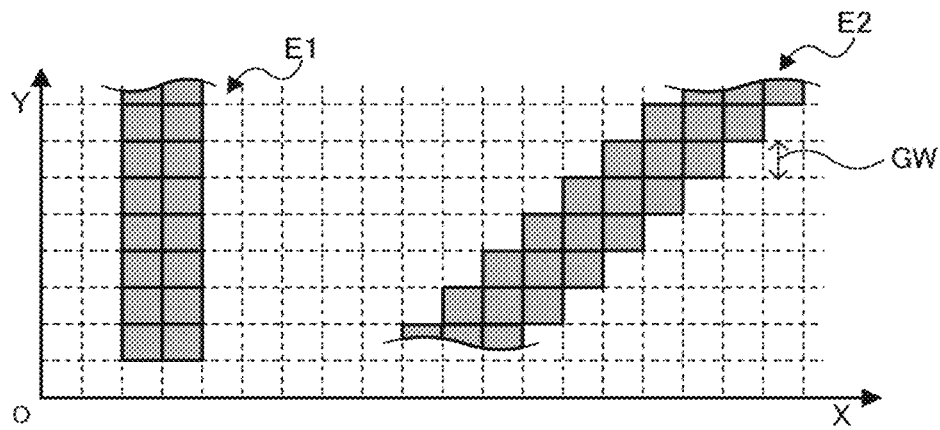
FIG. 7 is an explanatory diagram illustrating an example of the determined number of dots.

FIG. 7 is an explanatory diagram illustrating an example of the determined number of dots. In a case of vertical wire E1 having an angle of 0°, an X-coordinate value of each intersection point P to be detected is constant, intersection-to-intersection distance L to be calculated is also substantially constant, and thus, each intersection-to-intersection distance L corresponds to any line width W having an angle of 0°. Accordingly, the number of dots in each scan line SL is determined as the same number of dots (two dots in FIG. 7) without variation. Further, in a case of inclination wire E2 having an angle of 45°, since prescribed width SW is inclined at a certain prescribed angle SA, and thus, X-coordinate values of respective intersection points P to be detected are shifted by the same value in the inclination direction of the wire, and since intersection-to-intersection distance L to be calculated is substantially constant, each intersection-to-intersection distance L corresponds to line width W of any one of angles 45°. Accordingly, the number of dots set for each scan line SL is determined as the same number of dots (three dots in FIG. 7) without variation.

Further, when it is determined in S130 that intersection-to-intersection distance L do not correspond to line width W of inclination wire E2, or when it is determined in S145 that the inclinations of the straight lines connecting intersection points P do not correspond to prescribed angle SA or are not parallel to each other, CPU 42 determines that the straight lines are horizontal wires E3 having an angle of 90° or that the straight lines are other wires set differently from prescribed width SW. In this case, CPU 42 determines intersection-to-intersection distance L (for example, intersection-to-intersection distance L3 in FIG. 5) as it is to line width W (S155) and determines the number of dots required to print (formation) of line width W (S160). In step S160, for example, CPU 42 determines the number of dots by dividing line width W by pixel width GW and rounding a first decimal place.

Figure 8:
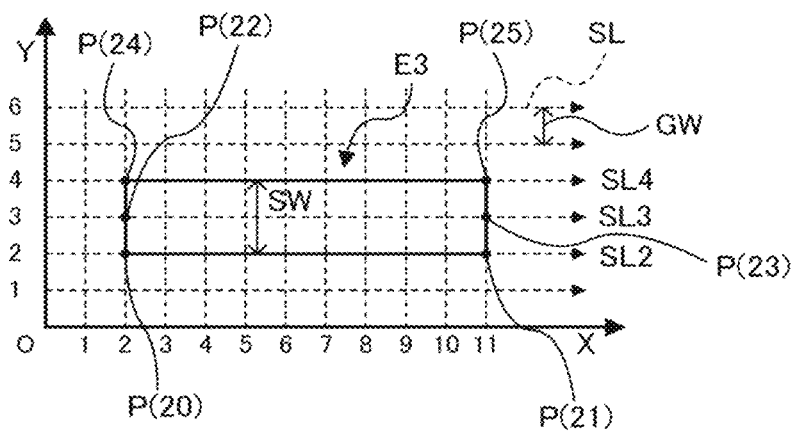
FIG. 8 is an explanatory diagram illustrating an example of a state in which scanning is performed without shifting a target image.
Figure 8:
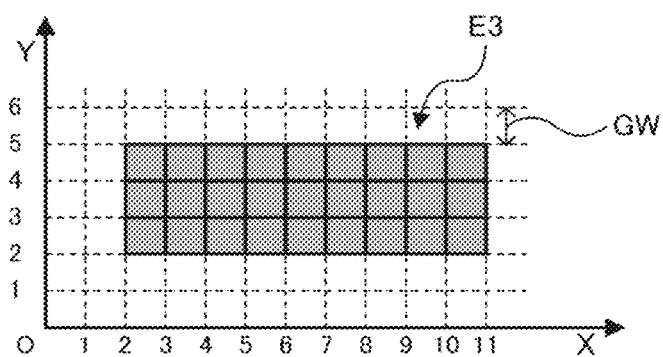
Figure 9:
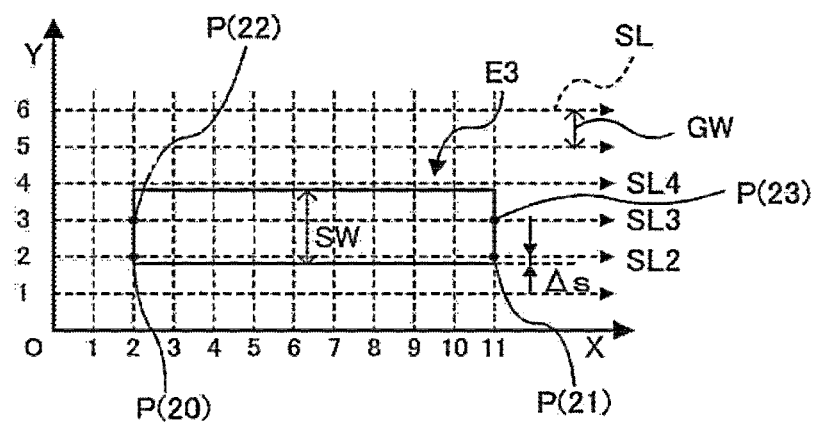
FIG. 9 is an explanatory diagram illustrating an example of a state in which a target image is scanned by being shifted by Δs.
Figure 9:
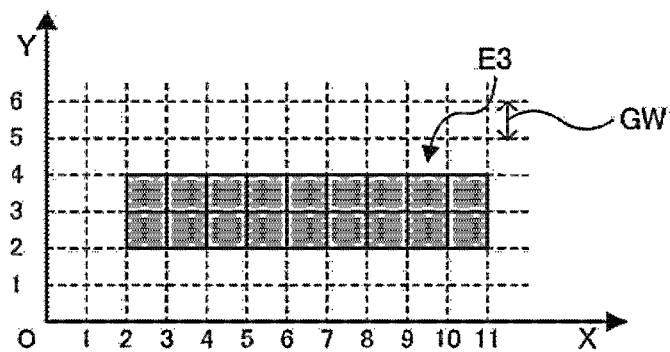

Here, a reason why a target image is shifted by Δs in S105 will be described. FIG. 8 is an explanatory diagram illustrating an example of a state in which scanning is performed without shifting the target image, and FIG. 9 is an explanatory diagram illustrating an example of a state in which scanning is performed by shifting the target image by Δs. FIG. 8 and FIG. 9 illustrate a case where there is a difference in presence or absence of shifting in the Y direction of horizontal wire E3 of which prescribed width SW is twice the predetermined width (for two pixels), that is, wire E3 of which width in the Y direction extends in X direction with prescribed width SW. FIGS. 8A and 9A illustrate wire E3 of a scan target, and FIGS. 8B and 9B illustrate a state in which formation of dots of each pixel is determined.

As illustrated in FIG. 8, when the target image is not shifted, scan lines SL2 and SL4 overlap outlines depending on coordinate values of vertices of horizontal wire E3, and a total of six intersection points P(20) to P(25) appear together with scan line SL3 therebetween. In this case, intersection-to-intersection distance L between intersection points P(20) and P(21), intersection-to-intersection distance L between intersection points P(22) and P(23), and intersection-to-intersection distance L between intersection points P(24) and P(25) are respectively calculated, and thus, line widths W thereof and the number of dots (9 dots) thereof are determined. Therefore, there are nine pixels in the X direction and three pixels (three rows) in the Y direction in dots, and the pixels have thicker line width than prescribed width SW of original horizontal wire E3. (FIG. 8B). In contrast to this, in the present embodiment, as described above, since a target image is shifted by Δs of the number of digits exceeding the number of significant digits after a decimal point in a coordinate system of the target image, coordinate values of vertices of horizontal wire E3 after the shifting are not integer values but values shifted from the integer values. Accordingly, as illustrated in FIG. 9, scan line SL4 does not overlap the outline of horizontal wire E3, and a total of four intersection points P(20) to P(23) appear on two scan lines SL2 and SL3. Therefore, there are nine pixels in the X direction and two pixels (two rows) in the Y direction in dots, and the pixels have appropriate line widths corresponding to prescribed width SW of original horizontal wire E3. Further, since shifting is made in a direction of being reduced by Δs, CPU 42 does not shift a starting point position of formation of a wire. For this reason, a target image is shifted by Δs in step S105 before scanning is started. CPU 42 may shift the entire target image by Δs in an xy direction or may shift the entire target image by Δs only in the y direction.

In the wiring print data generation processing, when the number of dots is determined in S140 and S160 CPU 42 determines whether there is unprocessed intersection point P (S165), and when it is determined that there is unprocessed intersection point P, the processing returns to S115 to be repeated. Meanwhile, when it is determined that there is no unprocessed intersection point P, CPU 42 generates raster data in which presence or absence of a dot in each pixel is designated as print data based on the coordinate value of intersection point P and the number of dots determined in S140 and S160 (S170) and ends the wiring print data generation processing. CPU 42 outputs the generated print data to control device 50. Control device 50 forms a wiring pattern by controlling wiring layer forming unit 37 based on the print data.

Figure 10:
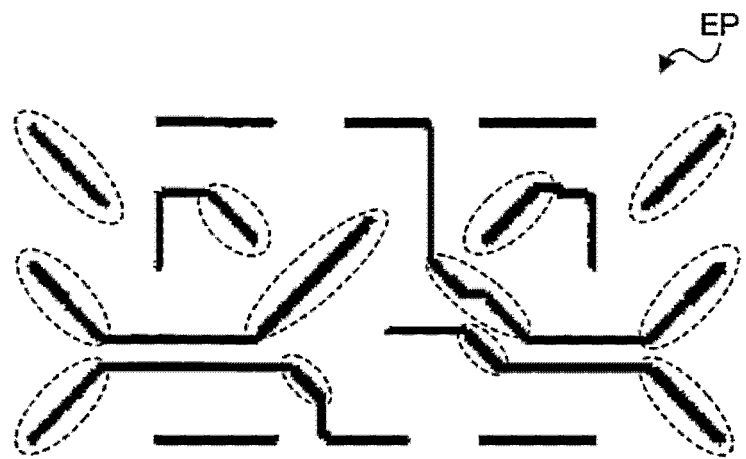
FIG. 10 is an explanatory diagram illustrating an example of a print result of wiring pattern EP.
Figure 10:
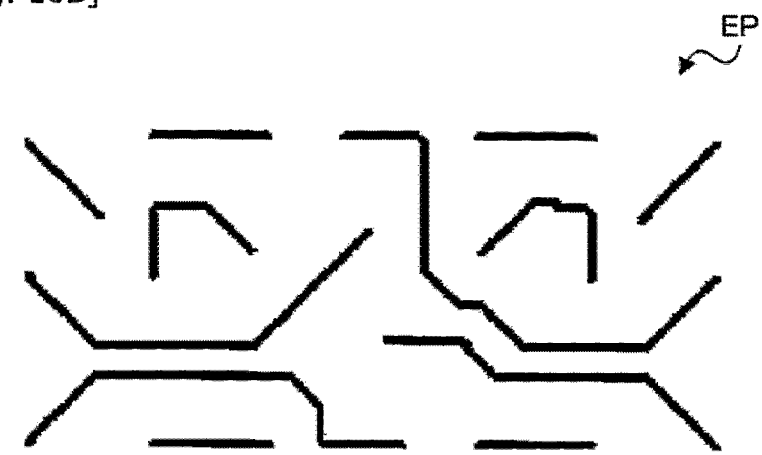

FIG. 10 is an explanatory diagram illustrating an example of a print result of wiring pattern EP. FIG. 10A illustrates a state of a comparative example, and FIG. 10B illustrates a state of the present embodiment. In the comparative example, the number of dots is determined by a method different from S125 to S150 of the wiring print data generation processing, and, for example, the number of dots of all wires is determined by a method of S155 and S160 in which intersection-to-intersection distance L is set to line width W and divided by pixel width GW and a first decimal place is rounded. In the comparative example, a large variation occurs in line widths of inclination wires, particularly, the line widths of the inclination wires are clearly thicker than horizontal wires or vertical wires as surrounded by dashed lines in FIG. 10A, and thus, resistance value of the wires also vary. In order to prevent the variation, it is necessary for an operator or the like to manually correct print data. In contrast to this, in the present embodiment, as illustrated in FIG. 10B, there is no large variation in the line widths, and wiring pattern EP can be stably formed with a substantially constant line width. Accordingly, a wiring board of the present embodiment can realize uniform resistance of wires, thereby stabilizing electrical quality.

Here, a correspondence relationship between constituent elements of the present embodiment and constituent elements of the present disclosure will be clarified. CPU 42 of image processing device 40 that performs S100 of the wiring print data generation processing of the present embodiment corresponds to an input section of the present disclosure, CPU 42 that performs S110 of the processing corresponds to a scan section, CPU 42 that performs S115 of the processing corresponds to a calculation section, and CPU 42 that performs S120 to S160 of the processing corresponds to a determination section. Further, HDD 48 for storing dot number determination table 48b corresponds to a storage section.

Image processing device 40 of the present embodiment described above sequentially performs scanning in the X direction at intervals of pixel width GW in the Y direction, detects respective intersection points P between outlines of wires E and scan lines SL, and calculates intersection-to-intersection distance L in the X direction. Then, image processing device 40 determines line width W of a wire based on intersection-to-intersection distance L, prescribed width SW of wire E, and a line width in the X direction of an inclination wire inclined according to prescribed angle SA, and determines formation of a dot corresponding to determined line width W for each pixel. Thereby, when a width in the X direction is equal to prescribed width SW of a wire, line width W can be appropriately determined based on intersection-to-intersection distance L and prescribed width SW. Further, even when a wire is inclined according to prescribed angle SA, line width W in the X direction can be appropriately determined based on intersection-to-intersection distance L and a line width of an inclination wire. Therefore, a line width can be appropriately determined by suppressing a variation in line width W of each wire E from a target image on which a wiring pattern is drawn.

Further, image processing device 40 determines prescribed width SW as line width W of wire E when intersection-to-intersection distance L corresponds to prescribed width SW, and determines the line width as line width W of wire E when intersection-to-intersection distance L corresponds to a line width of inclination wire E2. Then, when intersection-to-intersection distance L does not correspond to either prescribed width SW or the line width of inclination wire E2, image processing device 40 determines intersection-to-intersection distance L as line width W of wire E. Accordingly, line width W of each wire can be easily determined by suppressing a variation therein. In addition, when the intersection-to-intersection distance L corresponds to the line width of inclination wire E2, image processing device 40 determines intersection-to-intersection distance L as line width of inclination wire E2 after checking that inclinations of straight lines connecting intersection point P of a calculation source of intersection-to-intersection distance L and intersection point P on next scan line SL correspond to prescribed angle SA. Accordingly, it is possible to prevent erroneous determination that a wire of a processing target is inclination wire E2.

Further, image processing device 40 associates a line width (prescribed width SW) of vertical wire E1 with the number of dots and determines the number of dots with reference to dot number determination table 48b obtained by associating a line width of inclination wire E2 with the number of dots. Accordingly, it is possible to quickly determine the number of dots and to prevent determination of the number of dots from varying. Further, since image processing device 40 performs scanning after a target image is shifted by Δs, it is possible to prevent an outline of wire E and scan line SL from overlapping with each other and furthermore to appropriately determine line width W of wire E.

The present disclosure is not limited to the embodiments described above, and it is needless to say that various forms can be implemented within the technical scope of the present disclosure.

For example, in the embodiments described above, line width W of wire E is determined by respectively determining whether intersection-to-intersection distance L corresponds to prescribed width SW or whether intersection-to-intersection distance L corresponds to a line width in the X direction of inclination wire E2; however the configuration is not limited to this. A line width may be determined by any method as long as line width W of a wire is determined based on intersection-to-intersection distance L, prescribed width SW of wire E, and a line width in a scan direction of inclination wire E2 inclined according to prescribed angle SA. Further, in the embodiment described above, the number of dots is determined with reference to dot number determination table 48b when line width W is determined; however the configuration is not limited to this, and the number of dots may be determined by a predetermined arithmetic expression when line width W is determined.

In the embodiment described above, although inclinations of straight lines connecting intersection point P of a processing target and intersection point P on next scan line SL are checked when intersection-to-intersection distance L corresponds to a line width of inclination wire E2; however the configuration is not limited to this, and checking the inclination of the straight line may be omitted.

In the embodiments described above, scanning is performed after a target image is shifted by Δs; however the configuration is not limited to this, and the scanning may be performed without shifting the target image. However, in order to avoid overlapping of an outline of wire E and scan line SL, it is preferable to perform the scanning after shifting.

Figure 11:
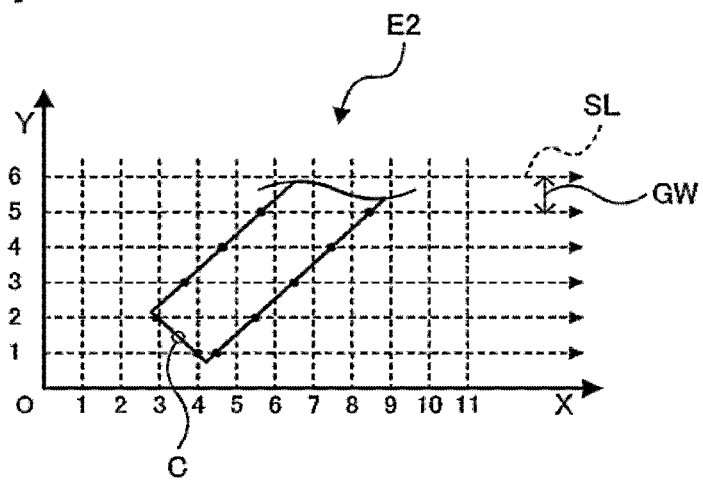
FIG. 11 is an explanatory diagram illustrating a state of movement processing of a modification example for inclination wire E2.
Figure 11:
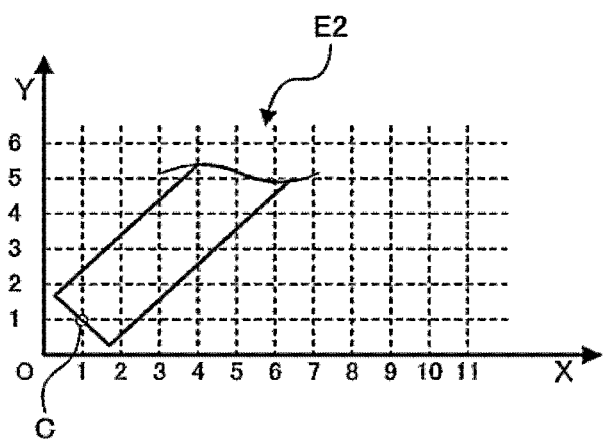
Figure 11:
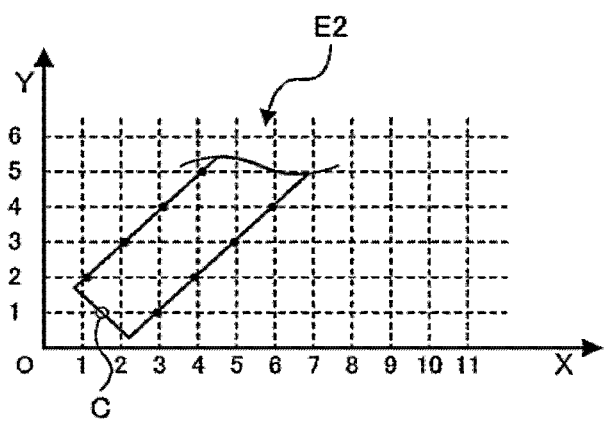

In the embodiments described above, there may be a case where an inclination wire inclined at prescribed angle SA by a line width other than prescribed width SW is included. In this case, for example, CPU 42 may perform processing to determine whether to form dots of each pixel corresponding to a coordinate value of intersection point P detected during scanning or may perform movement processing of an inclination wire as described below. FIG. 11 is an explanatory diagram illustrating a state of movement processing of a modification example with respect to inclination wire E2. In FIG. 11A, CPU 42 detects intersection points P between an outline of inclination wire E2 and scan line SL in the same manner as the embodiment. Next, CPU 42 checks that inclination wire E2 is present in the same manner as in S145 of the wiring print data generation processing. Here, as illustrated in FIG. 11A, since coordinate values of respective intersection points P do not have integer values depending on positions of inclination wire E2, determination of rounding down or rounding up the coordinate values of respective intersection points P may vary, and thus, determination of line width W for each scan line SL may be shifted by one pixel. Further, even among inclination wires E2 having the same line width, the determination may vary, and thus, the inclination wires may be determined to have different line widths W. Accordingly, in the modification example, CPU 42 moves midpoint C of an end side at a predetermined position of inclination wire E2 so as to be a predetermined reference position, for example, a coordinate value (1, 1) or an origin point (0, 0) (FIG. 11B), and furthermore moves in parallel in the X direction by a half pixel (a predetermined amount) (FIG. 11C). After setting inclination wire E2 in such a state, CPU 42 acquires coordinate values of intersection points P to determine whether to form dots of respective pixels. Thereby, it is possible to suppress a variation in determination of rounding down or rounding up coordinate values of respective intersection points P, and thus, line width W can be stably determined.

In the embodiments described above, image processing device 40 is included in 3D printer unit 20 but may be included in design device 12 or may serve as a single device without being limited thereto. Further, in the embodiments described above, image processing device 40 is exemplified as an image processing device of the present disclosure but may be provided in the form of an image processing method or a program thereof without being limited thereto.

Here, the image processing device of the present disclosure may be configured as follows. For example, in an image processing device of the present disclosure, a determination section may determine the prescribed width as a line width of a wire when an intersection-to-intersection distance corresponds to the prescribed width, and may determine a line width of an inclination wire as the line width of the wire when the intersection-to-intersection distance corresponds to the line width of the inclination wire, and may determine the intersection-to-intersection distance as the line width of the wire when the intersection-to-intersection distance does not correspond to either the prescribed width or the line width of the inclination wire. By doing so, a variation in line width is suppressed, and thus, it is possible to easily determine a line width of a wire having a prescribed width not inclined along a scan direction or an inclination wire according to a prescribed angle. Further, a line width in a scan direction can also be easily determined for a wire of which prescribed width direction extends in the scan direction while being orthogonal to the scan direction.

In the image processing device of the present disclosure, when the intersection-to-intersection distance corresponds to the line width of the inclination wire, the determination section may determine the line width of the inclination wire as the line width of the wire after checking that inclination of a straight line connecting the intersection point of a calculation source of the intersection-to-intersection distance and the intersection point closest to the intersection point on a next scan line corresponds to the prescribed angle. By doing so, not only an intersection-to-intersection distance but also whether inclination of a straight line connecting an intersection point can be checked, and thus, it is possible to prevent erroneous determination as an inclination wire.

The image processing device of the present disclosure may further include a storage section that stores correspondence information obtained by associating the prescribed width with the number of dots required for printing and associating the line width of the inclination wire with the number of dots required for printing, and when the line width of the wire is determined as the prescribed width or the line width of the inclination wire, the determination section may determine the number of dots with reference to the correspondence information. By doing so, it is possible to quickly determine the number of dots and to prevent determination of the number of dots from varying.

In the image processing device of the present disclosure, the scan section may perform the scanning after shifting an image of a target of the scanning by a value of the number of digits exceeding a number of significant digits after a decimal point in a coordinate system in which the wiring pattern is drawn. By doing so, when scanning a wire extending in a scan direction with a prescribed width orthogonal to the scan direction, it is possible to prevent an outline of a wire having the prescribed width that is an integer multiple of a predetermined value, and a scan line having an interval of the predetermined value from overlapping each other. Accordingly, since the outline of the wire overlaps the scan line, it is possible to prevent a width of the wire extending in the scan direction from being determined to be greater than an actual width.

An image processing method of the present disclosure is an image processing method of processing an image in which a wiring pattern is drawn and outputting the image as raster data in which formation content of wiring print dots is defined for each pixel, and has a key point including (a) a step of receiving the image in which the wiring pattern including a wire having a prescribed width that is an integer multiple of a pixel width and a prescribed angle that is an integer multiple of a predetermined angle is drawn, (b) a step of sequentially performing scanning in a scan direction at intervals of the pixel width in a direction orthogonal to the scan direction to detect respective intersection points between an outline of the wire and respective scan lines, (c) a step of calculating an intersection-to-intersection distance in the scan direction based on positions of the intersection points, and (d) a step of determining a line width of the wire in the scan direction and determining formation of dots for the determined line width for each pixel based on the intersection-to-intersection distance, the prescribed width, and a line width of an inclination wire which is the line width, in the scan direction, of a wire inclined according to the prescribed angle. In the same manner as the image processing device described above, the image processing method of the present disclosure can suppress a variation in line width of each wire from an image in which a wiring pattern is drawn, thereby appropriately determining the line width. In the image processing method, an aspect of the image processing device described above may be employed, or a step of performing functions of the image processing device described above may be included.

A program of the present disclosure has a key point in which at least one computer perform steps of the image processing method described above. The program may be recorded on a computer-readable recording medium (for example, a hard disk, a ROM, an FD, a CD, a DVD, or the like), may be transmitted from one computer to another computer through a transmission medium (a communication network such as the Internet or a LAN), or may be exchanged in any other manner. When the program is executed by one computer or respective steps are shared and performed by multiple computers, respective steps of the image processing method described above are performed, and thus, the same operation and effect as in the method can be obtained.

INDUSTRIAL APPLICABILITY

The present disclosure can be used in, for example, a technical field of image processing for forming wires by printing.

REFERENCE SIGNS LIST

10 wiring board manufacturing system, 12 design device, 13 CPU, 14 ROM, 15 RANI, 16 HDD, 16a design program, 16b substrate design data, 16c wiring design data, 17 display device, 18 input device, 20 3D printer unit, 30 printer body, 31 stage, 32 conveyance device, 33 lifting and lowering device, 34 resin layer forming unit, 35 ejection head, 36 UV light irradiation device, 37 wiring layer forming unit, 38 ejection head, 39 infrared ray irradiation device, 40 image processing device, 42, 52 CPU, 44, 54 ROM, 46, 56 RAM, 48, 58 HDD, 48a processing program, 48b dot number determination table, 50 control device

The invention claimed is:

1. An image processing device that processes an image in which a wiring pattern is drawn and outputs the image as raster data in which formation content of wiring print dots is defined for each pixel, the image processing device comprising:
an input section configured to receive the image in which the wiring pattern including a wire having a prescribed width that is an integer multiple of a pixel width of the pixel and a prescribed angle that is an integer multiple of a predetermined angle is drawn;
a scan section configured to sequentially perform scanning in a scan direction at intervals of the pixel width in a direction orthogonal to the scan direction to detect respective intersection points between an outline of the wire and respective scan lines;
a calculation section configured to calculate an intersection-to-intersection distance in the scan direction based on positions of the intersection points; and
a determination section configured to determine a line width of the wire in the scan direction and determine formation of dots for the determined line width for each pixel based on the intersection-to-intersection distance, the prescribed width, and a line width of an inclination wire which is the line width, in the scan direction, of a wire inclined according to the prescribed angle.

2. The image processing device according to claim 1, wherein the determination section determines the prescribed width as the line width of the wire when the intersection-to-intersection distance corresponds to the prescribed width, determines the line width of the inclination wire as the line width of the wire when the intersection-to-intersection distance corresponds to the line width of the inclination wire, and determines the intersection-to-intersection distance as the line width of the wire when the intersection-to-intersection distance does not correspond to both the prescribed width and the line width of the inclination wire.

3. The image processing device according to claim 2, wherein, when the intersection-to-intersection distance corresponds to the line width of the inclination wire, the determination section determines the line width of the inclination wire as the line width of the wire after checking that inclination of a straight line connecting the intersection point of a calculation source of the intersection-to-intersection distance and the intersection point closest to the intersection point on a next scan line corresponds to the prescribed angle.

4. The image processing device according to claim 1, further comprising:
a storage section configured to store correspondence information obtained by associating the prescribed width with a number of dots required for printing and associating the line width of the inclination wire with the number of dots required for printing,
wherein, when the line width of the wire is determined as the prescribed width or the line width of the inclination wire, the determination section determines the number of dots with reference to the correspondence information.

5. The image processing device according to claim 1, wherein the scan section performs the scanning after shifting an image of a target of the scanning by a value of a number of digits exceeding a number of significant digits after a decimal point in a coordinate system in which the wiring pattern is drawn.

6. An image processing method of processing an image in which a wiring pattern is drawn and outputting the image as raster data in which formation content of wiring print dots is defined for each pixel, the image processing method comprising:
(a) a step of receiving the image in which the wiring pattern including a wire having a prescribed width that is an integer multiple of a pixel width of the pixel and a prescribed angle that is an integer multiple of a predetermined angle is drawn;
(b) a step of sequentially performing scanning in a scan direction at intervals of the pixel width in a direction orthogonal to the scan direction to detect respective intersection points between an outline of the wire and respective scan lines;
(c) a step of calculating an intersection-to-intersection distance in the scan direction based on positions of the intersection points; and
(d) a step of determining a line width of the wire in the scan direction and determining formation of dots for the determined line width for each pixel based on the intersection-to-intersection distance, the prescribed width, and a line width of an inclination wire which is the line width, in the scan direction, of a wire inclined according to the prescribed angle.

7. A non-transitory computer readable storage medium that stores instructions which, when executed by a computer, implement an image processing method of processing an image in which a wiring pattern is drawn and outputting the image as raster data in which formation content of wiring print dots is defined for each pixel, comprising:
(a) a step of receiving the image in which the wiring pattern including a wire having a prescribed width that is an integer multiple of a pixel width of the pixel and a prescribed angle that is an integer multiple of a predetermined angle is drawn;

(b) a step of sequentially performing scanning in a scan direction at intervals of the pixel width in a direction orthogonal to the scan direction to detect respective intersection points between an outline of the wire and respective scan lines;
(c) a step of calculating an intersection-to-intersection distance in the scan direction based on positions of the intersection points; and
(d) a step of determining a line width of the wire in the scan direction and determining formation of dots for the determined line width for each pixel based on the intersection-to-intersection distance, the prescribed width, and a line width of an inclination wire which is the line width, in the scan direction, of a wire inclined according to the prescribed angle.

* * * * *